United States Patent [19]
Ota

[11] Patent Number: 5,914,774
[45] Date of Patent: *Jun. 22, 1999

[54] PROJECTION EXPOSURE APPARATUS WITH FUNCTION TO MEASURE IMAGING CHARACTERISTICS OF PROJECTION OPTICAL SYSTEM

[75] Inventor: Kazuya Ota, Tokyo, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/572,066

[22] Filed: Dec. 14, 1995

[30] Foreign Application Priority Data

Dec. 15, 1994 [JP] Japan ..................................... 6-311983

[51] Int. Cl.$^6$ ........................... G03B 27/42; G03B 27/52; G03B 27/54
[52] U.S. Cl. .................................. 355/55; 355/53; 355/67
[58] Field of Search ................................... 355/53, 55, 57, 355/60, 61, 62, 63, 66; 356/399, 400, 401

[56] References Cited

U.S. PATENT DOCUMENTS

| | | | |
|---|---|---|---|
| 4,585,342 | 4/1986 | Lin et al. | 356/124 |
| 5,121,160 | 6/1992 | Sano et al. | 355/53 O |
| 5,153,916 | 10/1992 | Inagaki et al. | 382/4 |
| 5,194,893 | 3/1993 | Nishi | 355/53 |
| 5,483,079 | 1/1996 | Yonezawa | 250/548 X |
| 5,615,006 | 3/1997 | Hirukawa et al. | 356/124 O |
| 5,635,722 | 6/1997 | Wakamoto et al. | 250/548 |

FOREIGN PATENT DOCUMENTS

| | | |
|---|---|---|
| 57-204128 | 12/1982 | Japan . |
| 58-7136 | 1/1983 | Japan . |
| 87-69107 | 3/1987 | Japan . |
| 87-11386 | 7/1987 | Japan . |
| 5-118957 | 5/1993 | Japan . |

*Primary Examiner*—R. L. Moses
*Assistant Examiner*—Shival Virmani
*Attorney, Agent, or Firm*—Vorys, Sater, Seymour and Pease LLP

[57] ABSTRACT

In a projection exposure apparatus for projecting an image of a pattern on a reticle through a projection optical system onto a wafer, in order to quickly measure imaging characteristics of the projection optical system without actual exposure, an enlarging optical system consisting of an objective lens and a relay optical system, and an image pickup element are provided on a Z-stage on which the wafer is mounted. Illumination light illuminates an index pattern formed on the reticle to form an image thereof near a first lens in the objective lens through the projection optical system, the enlarging optical system enlarges the thus formed image of the index pattern to form an enlarged image thereof on a receiving surface of the image pickup element, the image pickup element converts it into a signal, and an image processing system processes the signal from the image pickup element, thereby measuring the imaging characteristics of the projection optical system, based on the processing results.

45 Claims, 5 Drawing Sheets

PROJECTION EXPOSURE APPARATUS WITH FUNCTION TO MEASURE IMAGING CHARACTERISTICS OF PROJECTION OPTICAL SYSTEM

BACKGROUND OF THE INVENTION

1. Field of the Invention

The present invention relates to a projection exposure apparatus for projecting an image of a pattern formed on a mask through a projection optical system onto a photosensitive substrate, and more particularly to a projection exposure apparatus which has a function to measure imaging characteristics of the projection optical system.

2. Related Background Art

For projection exposure apparatus used in the lithography process for fabricating semiconductor devices or liquid crystal displays, etc., it remains necessary to measure imaging characteristics of the projection optical system, such as the best focus position, distortion, and projection magnification. For example, the best focus position is used as a target value for positioning the photosensitive substrate such as a wafer or a glass plate to be exposed in the direction of the optical axis of the projection optical system (or in the Z-direction). Since distortion could be a cause of registration error when different projection exposure apparatus are used for exposures in different layers on the photosensitive substrate, such adjustment is necessary as to keep distortion below a predetermined permissible value. Similarly, the projection magnification needs to be controlled within a predetermined range.

One conventional method for measuring imaging characteristics is a method for performing test print. For example, in order to measure the best focus position, a test print operation is carried out as follows: an actual photosensitive substrate is placed on a wafer stage, and the apparatus repeats a step of shifting the photosensitive substrate in the Z-direction vertically to effect exposure of a pattern on a reticle and thereafter horizontally shifting the photosensitive substrate, thereby performing sequential test print while changing Z-directional positions in predetermined steps. Then the best focus position can be determined at a Z-directional position where a photoresist pattern obtained by developing the photosensitive substrate is clearest. As for the distortion and projection magnification, exposure is carried out on the photosensitive substrate, using a test reticle in which patterns for measurement are formed in predetermined arrangement, and they can be obtained by measuring deviation of the arrangement of patterns obtained after development.

Another example of the conventional measuring methods is the so-called stage slit method in which a reference member with a slit formed thereon is mounted on the wafer stage and light passing through the slit is detected by a photoelectric sensor disposed on the bottom side of the slit. In this stage slit method, for example, an image of a pattern of a test reticle is projected through the projection optical system to the wafer stage side, stage scanning is repeated many times in every direction of the image, and light passing through the slit is detected by the photoelectric sensor, thereby measuring distortion etc. without performing actual exposure.

The test print method including actual exposure of photosensitive substrate among the conventional measuring methods of imaging characteristics of projection optical system had a disadvantage of lack of quickness because of inclusion of the development step.

The stage slit method had a disadvantage that the measuring time was still long, because stage scanning needed to be repeated many times in every direction of the image, that is, because information of image could not be obtained without scanning of the wafer stage. Particularly in the case of the projection exposure apparatus using a light source for generating pulsed laser light such as excimer light, the resolution of image decreased with an increase in the scanning speed of the wafer stage from restriction of pulse frequency, and thus, the scanning speed of wafer stage could not be increased over a specific speed, thus resulting in having a particular disadvantage that the measuring time was long.

SUMMARY OF THE INVENTION

An object of the present invention is to provide a projection exposure apparatus capable of quickly measuring imaging characteristics of projection optical system without performing test print.

A projection exposure apparatus according to the present invention has a projection optical system for projecting an image of a pattern on a mask onto a photosensitive substrate, and a substrate stage for moving the substrate in a direction parallel to the optical axis of the projection optical system and on a plane perpendicular to the optical axis, wherein the apparatus is provided with an enlarging optical system for enlarging an image of the predetermined pattern projected through the projection optical system toward the substrate stage to form an enlarged image thereof on a predetermined observation surface, and image pickup means for picking up the enlarged image of the image of the predetermined pattern on the predetermined observation surface.

In this case, an example of the predetermined pattern is a reference pattern formed on the mask.

A preferred arrangement may be such that a first lens closest to the surface of the substrate stage out of lenses composing the enlarging optical system is fixed to the substrate stage and that the image pickup means and at least a part of the enlarging optical system are detachably arranged on the substrate stage.

It is also preferred that a surface opposed to the projection optical system, of the lens closest to the projection optical system out of the lenses composing the enlarging optical system be substantially flat.

Further, it is preferred that the surface opposed to the projection optical system, of the lens closest to the projection optical system out of the lenses composing the enlarging optical system be located at the same height as the surface of the photosensitive substrate mounted on the substrate stage.

The projection exposure apparatus of the present invention can obtain the imaging characteristics of the projection optical system in such a manner that the image pickup means picks up the enlarged image of the predetermined pattern enlarged by the enlarging optical system and that image processing is effected on the enlarged image thus picked up. For example, the best focus position can be obtained by vertically moving the substrate stage and finding a position to maximize the contrast of the enlarged image of the predetermined pattern. Curvature of field can be measured by measuring the best focus position at each of plural points in the exposure field, and further, astigmatism and distortion (including an error of image magnification), etc. of the projection optical system can also be measured by devising the configuration of the predetermined pattern and the processing method.

In the case where the first lens closest to the surface of the substrate stage in the lenses composing the enlarging optical system is fixed to the substrate stage and where the image pickup means and at least a part of the enlarging optical system are detachably arranged on the substrate stage, the detachable part of the optical system is mounted on the substrate stage upon measuring the imaging characteristics of projection optical system, and then removed upon performing exposure. This decreases a load on the substrate stage upon exposure and facilitates control of the substrate stage.

In the case where the surface opposed to the projection optical system, of the lens closest to the projection optical system out of the lenses composing the enlarging optical system is substantially flat, an index mark or the like can readily be formed in the flat portion. Further, an autofocusing beam can be radiated onto the flat portion, which facilitates position control of the enlarging optical system.

Further, in the case where the surface opposed to the projection optical system, of the lens closest to the projection optical system, is located at the same height as the surface of the photosensitive substrate mounted on the substrate stage, there is no need to consider offset upon performing an autofocus operation.

DESCRIPTION OF THE PREFERRED EMBODIMENTS

An embodiment of the projection exposure apparatus according to the present invention will be explained referring to FIG. 1 to FIG. 6. The present embodiment is an example in which the present invention is applied to a step-and-repeat type projection exposure apparatus for exposing each shot area on the wafer with an image, demagnified through the projection optical system, of the pattern on the reticle.

Figure 1:
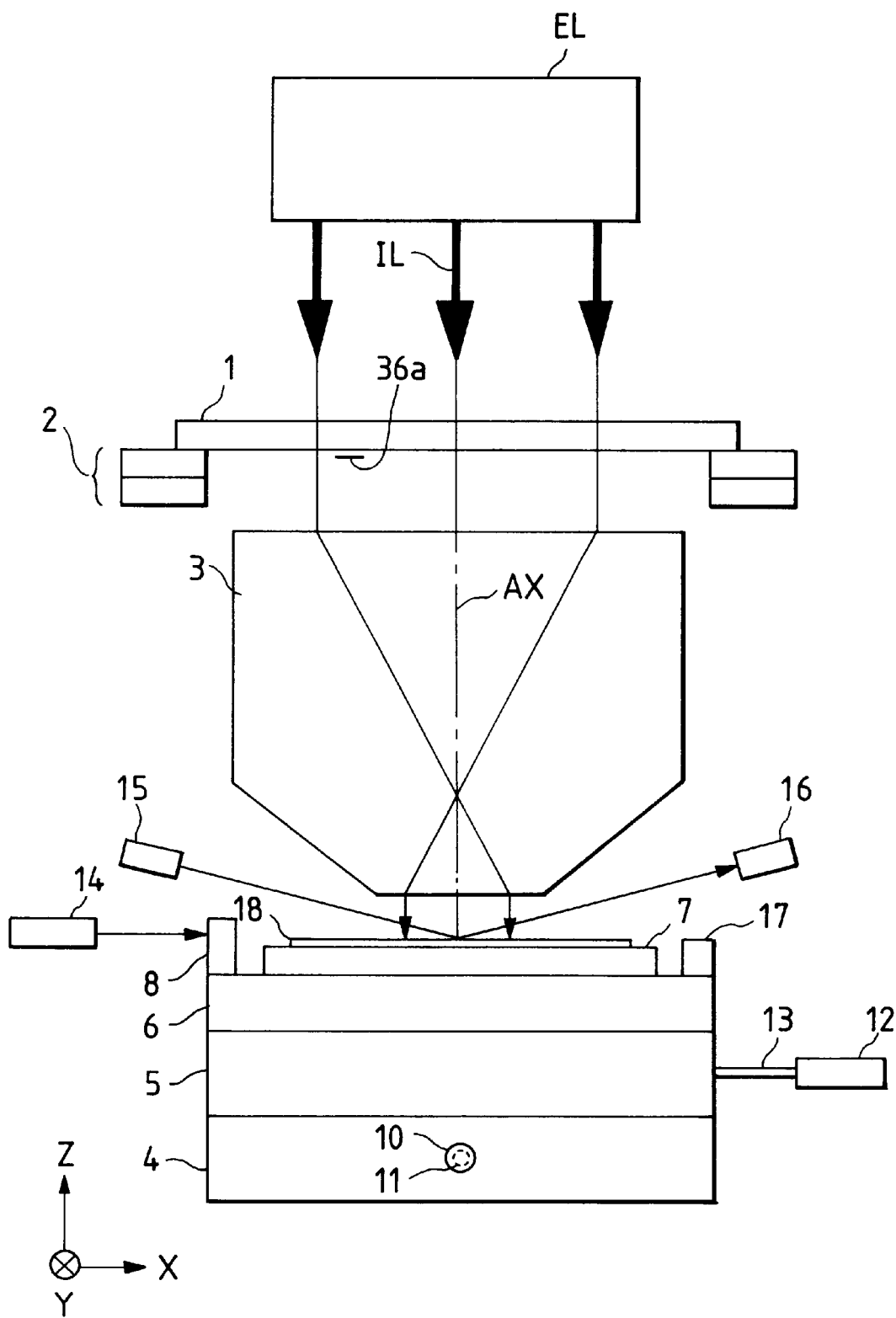
FIG. 1 is a schematic, structural drawing to show an embodiment of the projection exposure apparatus according to the present invention.

FIG. 1 shows the schematic configuration of the projection exposure apparatus of the present embodiment. In FIG. 1, illumination light IL for exposure emitted from an illumination optical system EL illuminates an illumination area on a reticle 1, and an image of a circuit pattern written in the illumination area is demagnified through the projection optical system 3 and transferred onto the surface of wafer 18. The applicable illumination light IL can be continuous light such as a bright line of mercury lamp (the i-line of wavelength 365 nm or the g-line of wavelength 436 nm, etc.) or pulsed laser light such as KrF excimer laser light and ArF excimer laser light. Here, in FIG. 1, the Z-axis is taken in parallel with the optical axis AX of projection optical system 3, the X-axis in parallel with the plane of FIG. 1 in a plane perpendicular to the optical axis, and the Y-axis perpendicular to the plane of FIG. 1.

In FIG. 1, the reticle 1 with circuit patterns written therein is vacuum-chucked on a reticle stage 2, and this reticle stage 2 positions the reticle 1 in the X-direction, in the Y-direction, and in the rotational direction (the θ-direction) within a two-dimensional plane (XY plane) perpendicular to the optical axis AX of the projection optical system 3. Coordinates of a position of the reticle stage 2 in the two-dimensional plane are always detected, for example, in the resolution of about 0.01 $\mu$m by unrepresented moving mirrors on the reticle stage 2 and laser interferometers disposed around the stage. Further, index patterns 36a–36e (among which only 36a is illustrated in FIG. 1) for measuring the imaging characteristics of the projection optical system 3 are formed around the circuit patterns on the reticle 1.

Figure 4:
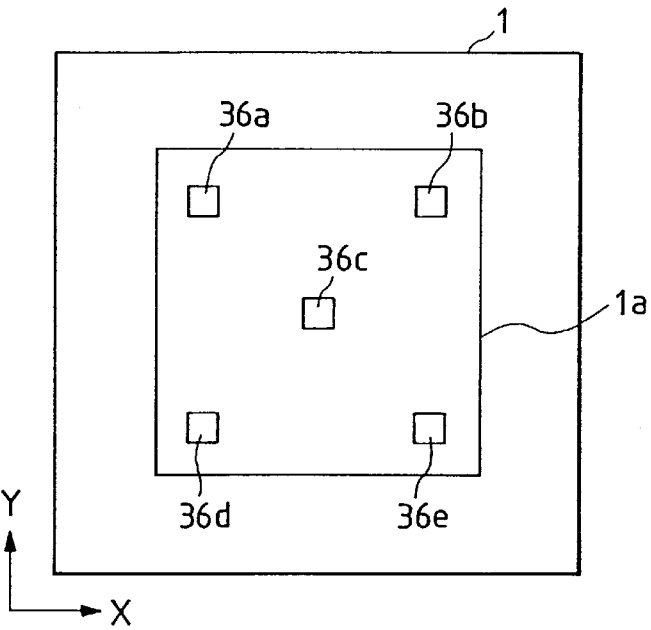
FIG. 4 is a plan view of reticle 1 shown in FIG. 1.

FIG. 4 is a plan view of the reticle 1 shown in FIG. 1. In this FIG. 4, the same index patterns 36a–36e are formed at the four corners and the center in a pattern area 1a where the circuit patterns are written, on the bottom surface of reticle 1.

Figure 5:
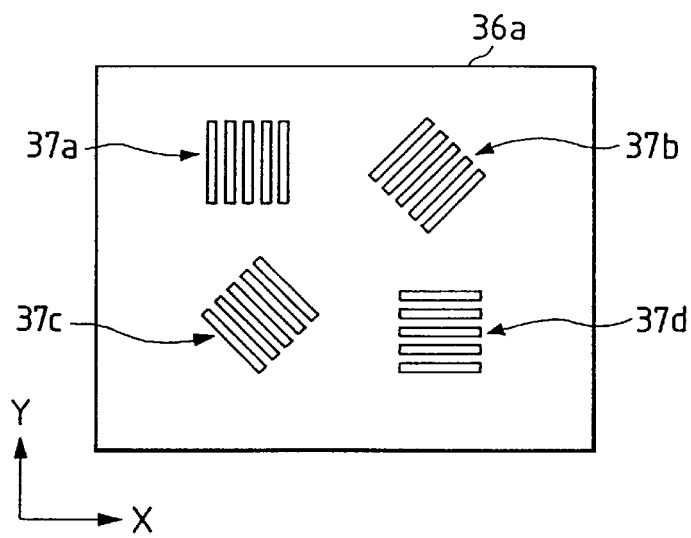
FIG. 5 is an enlarged drawing to show a pattern arrangement of reference pattern 36a shown in FIG. 4.

FIG. 5 is an enlarged view of the index pattern 36a shown in FIG. 4. In FIG. 5, four types of basic patterns 37a–37d are formed in the index pattern 36a. These basic patterns 37a–37d all are the same line-and-space patterns, but are different in direction from each other. The basic patterns 37a, 37d are patterns substantially parallel to the Y-direction and to the X-direction, respectively, and the basic patterns 37b, 37c are patterns parallel to a direction which is rotated about 45° counterclockwise from the X-direction and to a direction which is rotated about 45° clockwise from the X-direction, respectively. The index patterns 36b–36e are formed similarly, each including the basic patterns directed in the various directions as described above. By changing the basic patterns to be measured depending upon the positions of the index patterns 36a–36e, for example, a difference of the imaging characteristics (for example, astigmatism) can be obtained between in the meridional direction and in the sagittal direction. The following description is given using a representative example of the index pattern 36a.

The basic patterns 37a–37d may be formed in mutually different shapes, and they do not have to be line-and-space patterns. Further, each index pattern may be formed at any suitable position on the reticle 1, and there is no restriction on the number of index patterns.

When the reticle 1 of FIG. 4 is constituted as an actual exposure target, the index patterns may be formed on street lines or the like, for example. On the reticle in this case there are reference marks for reticle alignment and reticle marks for final alignment formed in addition to the above circuit patterns and index patterns. As a convenient alternative, the reticle 1 of FIG. 4 may be constituted by a test reticle on which only the index patterns are formed.

Returning to FIG. 1, the configuration around the wafer stage is next explained. The wafer stage is a generic name of the total stage including a wafer holder 7, a Z-stage 6, an X-stage 5, and a Y-stage 4, etc.

As shown in FIG. 1, the wafer 18 is held by vacuum suction on the wafer holder 7, and the wafer holder 7 is mounted on the Z-stage 6. The Z-stage 6 is mounted on the X-stage 5 movable in the X-direction across the length corresponding to the diameter of a maximum wafer which this projection exposure apparatus can expose, and the X-stage 5 is mounted on the Y-stage 4 movable in the Y-direction across the length corresponding to the diameter of the maximum wafer.

The Y-stage 4 is driven by a motor 10 through a feed screw 11 to move in the Y-direction relative to the apparatus base (not shown), and the X-stage 5 is driven by a motor 12 through a feed screw 13 to move in the X-direction relative to the Y-stage 4. The Z-stage 6 includes a leveling stage and a rotating stage, and is arranged so that, by a drive unit (not shown), it can be inclined in an arbitrary direction relative to the image plane of the projection optical system 3 and it can finely be moved in the direction of the optical axis AX (in the Z-direction). The Z-stage 6 can be rotated about the optical axis AX.

Further, as shown in FIG. 1, a laser interferometer 14 is located beside the Z-stage 6 in the −X-direction, and in correspondence thereto, a moving mirror 8 for reflecting light from the laser interferometer 14 is provided at the −X-directional end of the Z-stage 6. Thus, a value of X-coordinate of the Z-stage 6 is measured by the laser interferometer 14. Further, though not shown in FIG. 1, a value of Y-coordinate of the Z-stage 6 is measured by laser a interferometer located in the +Y-direction of the Z-stage 6 and a moving mirror 9 (FIG. 2) provided at the +Y-directional end of the Z-stage 6 in correspondence thereto.

Further, the apparatus in FIG. 1 is provided with an oblique-incidence-type multi-point focus position detecting system composed of an irradiation optical system 15 for projecting an image of stripe patterns obliquely to the optical axis AX toward an exposed surface of wafer 18 near the image plane of the projection optical system 3, and a receiving optical system 16 for refocusing the image of the stripe patterns with reflected light from the projected image. This multi-point focus position detecting system 15, 16 detects Z-directional positions (focus positions) of the surface of wafer 18 in the entire plane in the exposure field of the projection optical system 3, and autofocusing (and further auto-leveling if necessary) is carried out so that the surface of wafer 18 may coincide with the image plane of the projection optical system 3, based on the detection information.

In the space of the inside and the top surface of the Z-stage 6 there are mounted an enlarging optical system 39 (see FIG. 3) for enlarging an aerial image of the index pattern 36a formed on the reticle 1, used to measure the imaging characteristics of the projection optical system 3, and an image pickup element 26 comprised of a two-dimensional CCD for converting the aerial image from the enlarging optical system 39 into an image signal. FIG. 1 shows only an objective lens system 17 closest to the projection optical system 3 out of lenses in the enlarging optical system 39.

Figure 2:
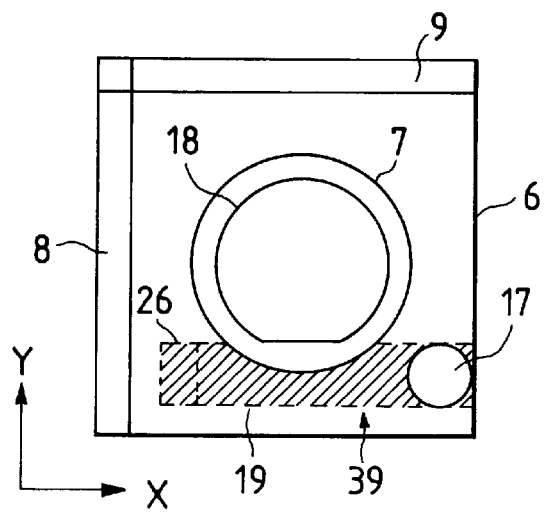
FIG. 2 is a plan view of Z-stage 6 shown in FIG. 1.

FIG. 2 is a plan view of the Z-stage 6 shown in FIG. 1, in which the enlarging optical system 39 consisting of the objective lens system 17 and a relay optical system 19, and the image pickup element 26 are mounted near the −Y-directional end in the space of the inside and the top surface of the Z-stage 6. Among them, the relay optical system 19 and image pickup element 26 are buried in the Z-stage 6 as shown by the hatched portion surrounded by the dashed line, extending from below the objective lens system 17 to the −X-directional end of the Z-stage 6. As described above, the moving mirrors 8, 9 for measuring the position of the Z-stage 6 are fixed to the −X-directional end and the +Y-directional end of the Z-stage 6.

Although the projection exposure apparatus of this example is provided with other various alignment systems, description thereof is omitted because they are not directly related to the present invention.

The enlarging optical system 39 and image pickup element 26 of this example are next explained in detail.

Figure 3:
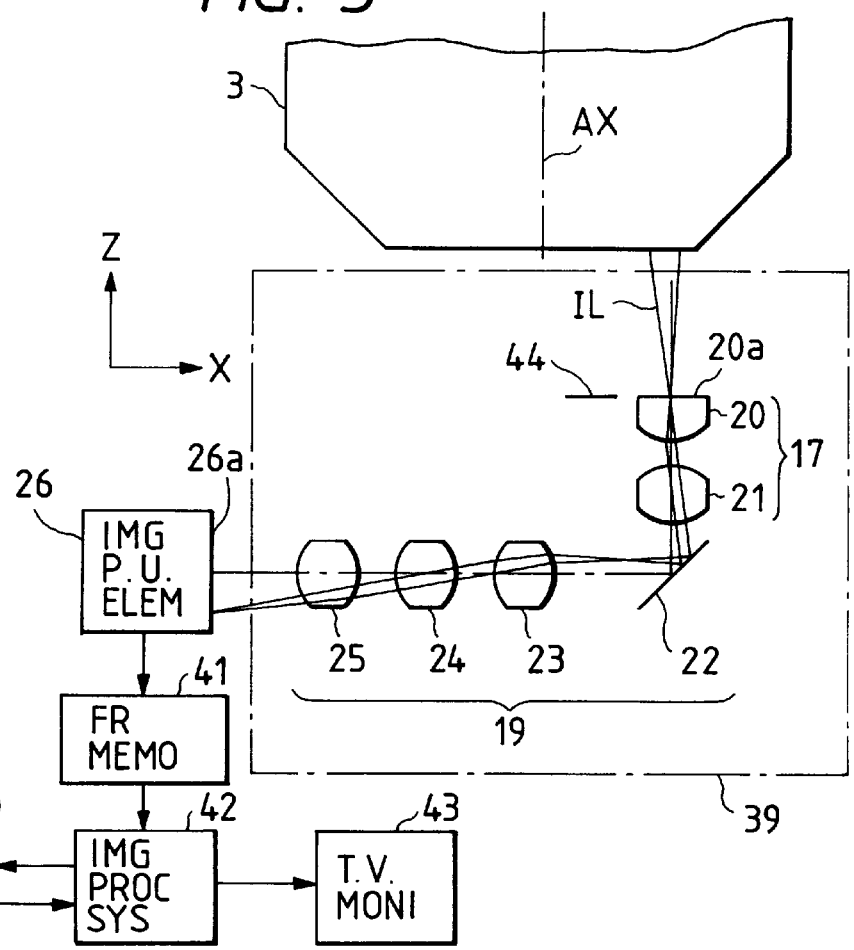
FIG. 3 is a schematic, structural drawing to show the enlarging optical system 39 and image pickup element 26 etc. shown in FIG. 2.

FIG. 3 shows the schematic configuration of the enlarging optical system 39, the image pickup element 26, and an image processing system, etc. In FIG. 3, the enlarging optical system 39 is composed of the objective lens system 17 and the relay optical system 19, and the relay optical system 19 is composed of a reflecting mirror 22 for bending a light beam from the objective lens system 17, and a plurality of lenses 23, 24, 25. The objective lens system 17 is composed of a first lens 20 and a second lens 21 arranged in this order from the side of the projection optical system 3, and a surface 20a opposed to the projection optical system 3, of the first lens 20 is flat. Further, the surface 20a of the first lens 20 is so arranged as to coincide with an exposed surface 44, which is located at the same height as the surface of wafer 18 shown in FIG. 1. The present embodiment is so arranged that the surface 20a of the first lens 20 is located at the same height as the exposed surface 44, but their heights do not have to be aligned on the same plane. In the case of the surface 20a being located at the same height as the exposed surface 44, for example if an index mark is formed on the surface 20a, the index mark can simultaneously be observed together with the image of the index pattern on the reticle.

In measuring the imaging characteristics, when the illumination light IL is radiated onto the index pattern 36a on the bottom surface of reticle 1 in FIG. 1, a demagnified image of the index pattern 36a is projected onto the image plane of the projection optical system 3. In FIG. 3, supposing the exposed surface 44 is aligned with the image plane, diverging light from the demagnified image forms an image of the index pattern 36a through the first lens 20, second lens 21, and reflecting mirror 22. Then the illumination light from the image advances through the relay optical system 19 to form an enlarged image of the index pattern 36a on a receiving surface 26a of the image pickup element 26. Namely, the exposed surface 44 is conjugate with the receiving surface 26a, and the projection magnification by the objective lens system 17 and relay optical system 19 is for example in the range of from 300× to 400×.

The enlarged image formed on the receiving surface 26a of the image pickup element 26 is converted into an image signal in the image pickup element 26, and the signal is stored in a frame memory 41. The signal thus stored is read out with necessity by an image processing system 42 under a command from a control system 40, and is subjected to various image processing including calculation of image contrast etc. in the image processing system 42. Those results are supplied to the control system 40. Further, the enlarged image of the index pattern 36a is arranged to be indicated on a television monitor 43, whereby the image can be visually observed.

Figure 6:
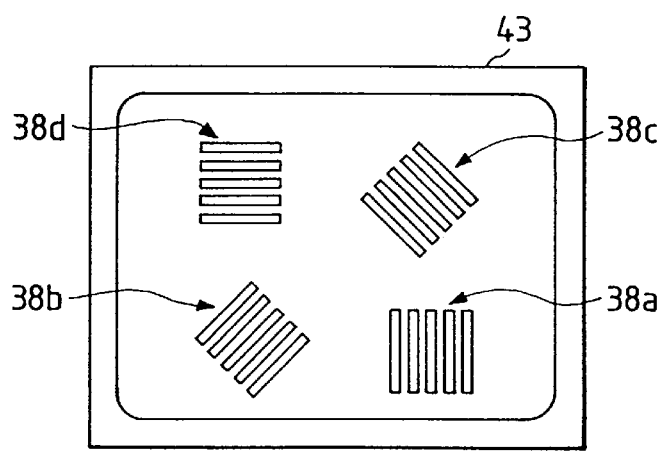
FIG. 6 is an enlarged image of reference pattern 36a of FIG. 5 displayed on a screen of a television monitor.

FIG. 6 shows an example of the image of the index pattern 36a indicated on the television monitor 43. As shown in FIG. 6, enlarged projection images 38a–38d corresponding to the basic patterns 37a–37d composing the index pattern 36a on the reticle 1 are indicated on the screen of the television monitor 43. When the exposed surface 44 is aligned with the image plane, the projection images 38a–38d become clearest, and the projection images 38a–38d become blurred in a defocus state.

A method for obtaining the best focus position is next explained mainly referring to FIG. 3.

First, the X-stage 5 and Y-stage 4 shown in FIG. 1 are moved so that the center of the objective lens system 17 may come into the exposure field of the projection optical system 3. On this occasion, the center of the objective lens system 17 does not have to be located at the center of the optical axis AX of the projection optical system 3, but it can be located at any position within the range of the exposure field. For example, if the exposure field is of 20 mm×20 mm, the center of the projection optical system 17 may be located anywhere within the range. Using the multi-point focus position detecting system 15, 16 of the present embodiment, a focus position can be detected at an arbitrary point within the two-dimensional exposure field.

After that, the illumination light IL illuminates the index pattern 36a on the reticle 1, and the objective lens system 17 is moved to a position where the demagnified image of the index pattern 36a is projected through the projection optical system 3. Then the demagnified image is focused near the surface 20a of the first lens 20 in the objective lens system 17 located at the same height as the wafer surface, and the image pickup element 26 picks up the image of the index pattern 36a enlarged by the objective lens system 17 and relay optical system 19. The image thus picked up is converted into an image signal in the image pickup element 26, and the image is indicated on the television monitor 43.

Then the focus position detecting system 15, 16 shown in FIG. 1 measures the Z-directional position of the surface 20a of the first lens 20, and, moving the Z-stage 6 up and down based on the result, the contrast of the image detected by the image pickup element 26 changes. These information is supplied to the image processing system 42, and the image processing system 42 determines the Z-directional position where the contrast becomes highest.

If the above operation is carried out at several points in the exposure field, for example if the above operation is carried out at the center and the four corners which are projection areas of the index patterns 36a–36e of FIG. 4, a degree of curvature of field can be obtained. Further, astigmatism of the projection optical system 3 can be obtained by a single measurement, using the index pattern 36a of the present embodiment composed of the basic patterns 37a, 37d comprised of line-and-space patterns parallel to the Y-direction and the X-direction and the basic patterns 37b, 37c comprised of the line-and-space patterns having the directions inclined about 45° clockwise and about 45° counterclockwise from the X-direction as shown in FIG. 5.

As explained above, the projection exposure apparatus of this example is arranged in such a manner that the index patterns 36a–36e are formed on the reticle 1, the enlarging optical system 39 and image pickup element 26 are provided in a space of the inside and the top surface of the Z-stage 6, the index pattern 36a–36e is illuminated by the exposure illumination light IL, the enlarging optical system 39 enlarges the demagnified projection image of an index pattern 36a–36e obtained through the projection optical system 3, the image pickup element 26 receives the enlarged image to convert it into an image signal, and the image processing system 42 and control system 40 process the image signal, whereby it can measure the imaging characteristics, such as the best focus position, astigmatism, and curvature of field, of the projection optical system 3. Further, for example, if intervals of the index pattern 36a–36e of FIG. 4 are accurately measured, even distortion or magnification error or the like of the projection optical system 3 can also be measured by obtaining deviation of the intervals of the projected image from a designed value.

Accordingly, measurement of the imaging characteristics of the projection optical system 3 can be carried out without inclusion of the step of actually performing exposure of wafer, which was needed heretofore. This shortens the measurement time, which improves the total throughput (productivity).

The conventional stage slit method required many repetitions of stage scanning in every direction of the image, whereas the image detecting method as in the present embodiment permits simultaneous pattern detection in plural directions, thus achieving a reduction of a time required for measurement.

Since the apparatus is provided with the objective lens system 17 having the first lens 20 in which the surface having the same height as the surface of wafer 18 and opposed to the projection optical system 3 is a flat surface, a focus position can be measured for the projection optical system 3 under the same conditions as with the wafer 18. Because of it, the best focus position etc. can accurately be measured by the compact optical system.

Another embodiment of the projection exposure apparatus of the present invention is next explained referring to FIG. 7 to FIGS. 9A, 9B. In the present embodiment, the enlarging optical system 39A is separated into a first relay optical system 46 and a second relay optical system 47, and the second relay optical system 47 and image pickup element are detachably arranged relative to the Z-stage 6. The other matters are the same as in the embodiment of FIG. 1, and portions in FIG. 7 to FIGS. 9A, 9B corresponding to those in FIG. 1 to FIG. 5 are denoted by the same reference numerals, the detailed description of which will be omitted.

Figure 7:
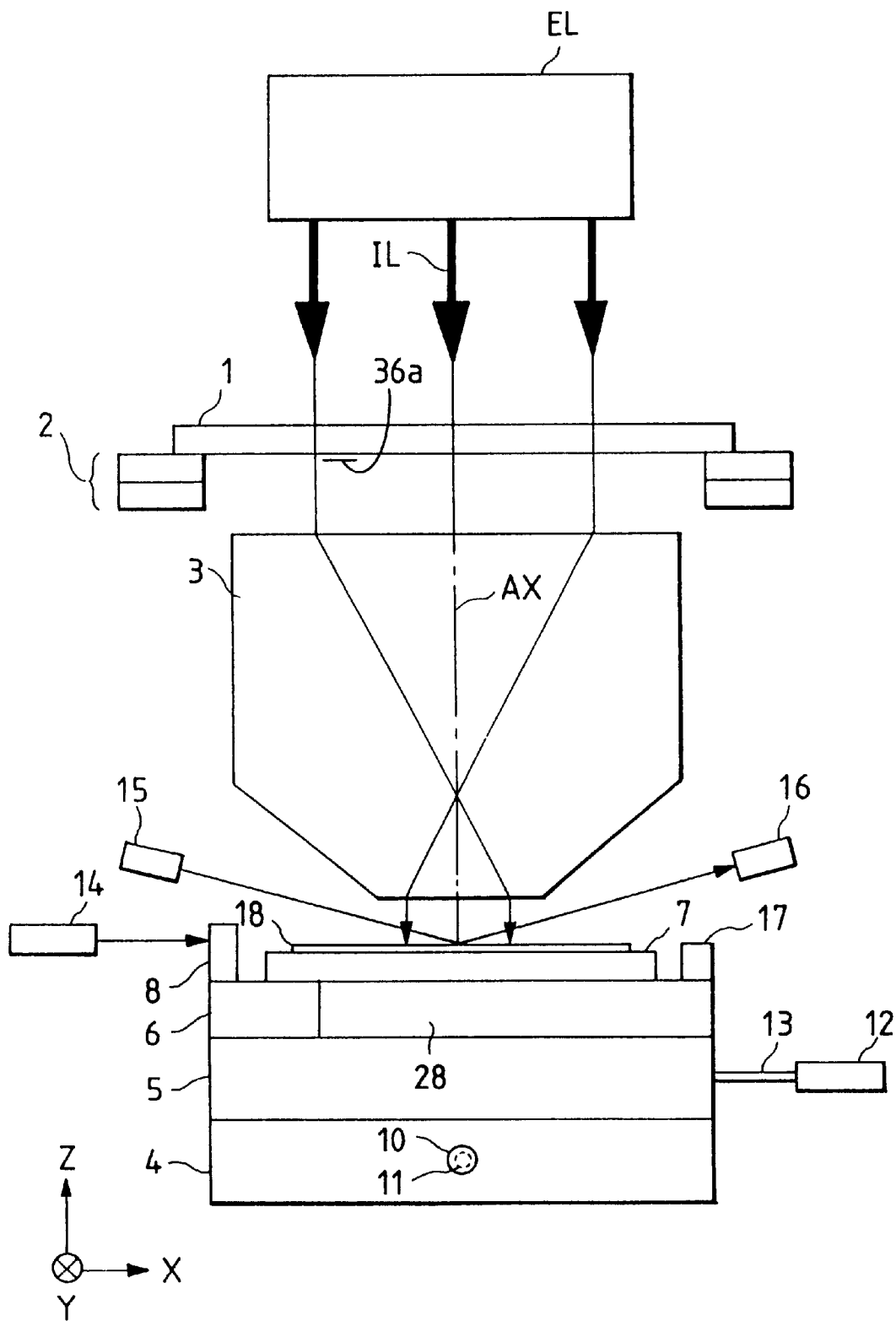
FIG. 7 is a schematic, structural drawing to show another embodiment of the projection exposure apparatus according to the present invention.

FIG. 7 shows the schematic configuration of the projection exposure apparatus of the present embodiment. In this FIG. 7, a housing member 28 in which the second relay optical system 47 and image pickup element 34 shown in FIGS. 9A, 9B are mounted is detachably provided on the −Y-directional side surface of the Z-stage 6. The apparatus is provided with the objective lens system 17 having the same configuration as in the previous embodiment, the enlarging optical system 39A consisting of the first relay optical system 46 shown in FIG. 8 and the second relay optical system 47, and the image pickup element 34.

Figure 8:
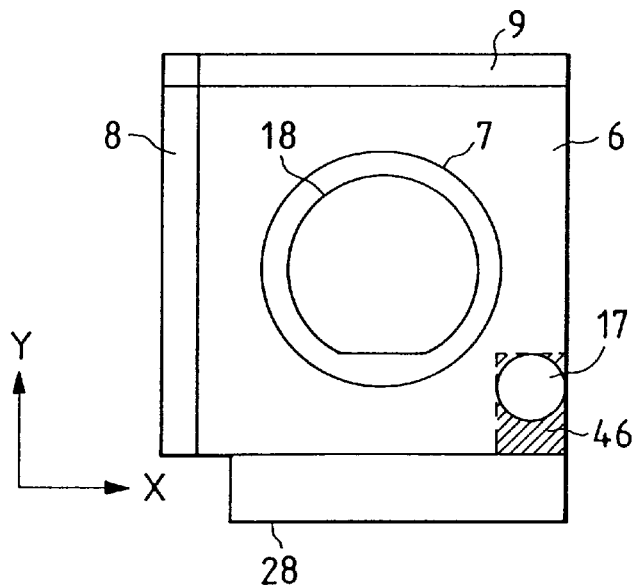
FIG. 8 is a plan view of Z-stage 6 shown in FIG. 7.
Figure 9A:
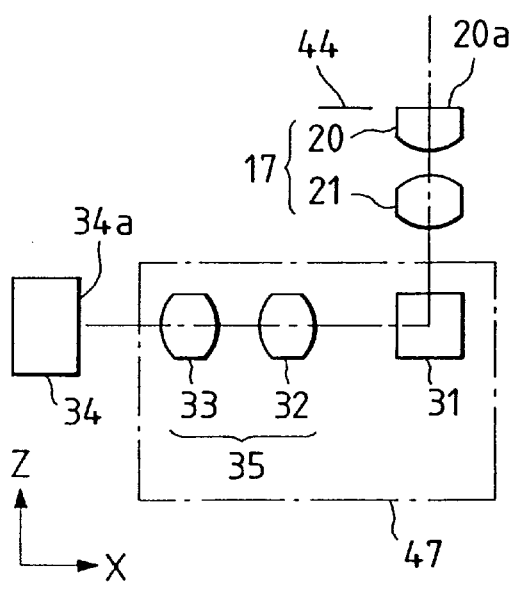
FIG. 9A is a view of the enlarging optical system 39A in the embodiment of FIG. 7, as observed in the +Y-direction.
Figure 9B:
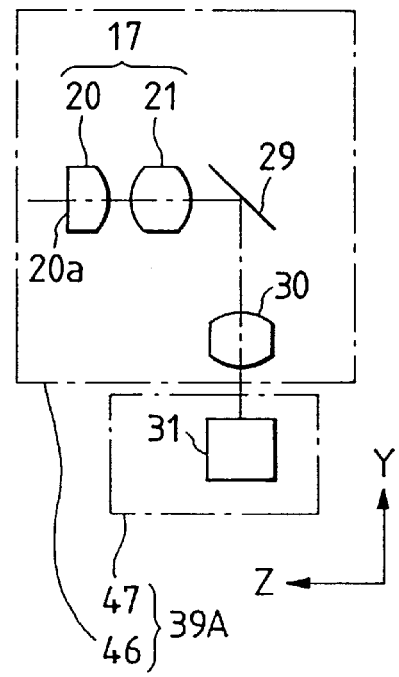
FIG. 9B is a view of the enlarging optical system 39A in the embodiment of FIG. 7, as observed in the −X-direction.

FIG. 8 is a plan view of the Z-stage 6 shown in FIG. 7. In this FIG. 8, the first relay optical system 46 is mounted as shown by the hatched portion surrounded by the dashed line, including the objective lens system 17. The housing member 28 detachably arranged on the Z-stage 6 houses the second relay optical system 47 shown in FIGS. 9A, 9B and the image pickup element 34 comprised of a two-dimensional CCD. The housing member 28 may be removed from the Z-stage 6 when the imaging characteristics are not measured.

FIGS. 9A and 9B show the schematic configuration of the enlarging optical system 39A and image pickup element 34 mounted in the projection exposure apparatus of FIG. 7. FIG. 9A shows the schematic structure when FIG. 7 is observed in the +Y-direction, and FIG. 9B shows the schematic structure when FIG. 7 is observed in the −X-direction. In these FIGS. 9A and 9B, the enlarging optical system 39A is separated into the first relay optical system 46 and the second relay optical system 47. The first relay optical system 46 is composed of the objective lens system 17 consisting of the first lens 20 and second lens 21, a reflecting mirror 29, and a third lens 30, and the second relay optical system 47 is composed of a reflecting mirror 31 and a relay optical system 35 consisting of a fourth lens 32 and a fifth lens 33. The first relay optical system 46 is fixed inside the Z-stage 6 of FIG. 8, and the second relay optical system 47 and image pickup element 34 are mounted in the housing member 28 shown in FIG. 8.

The surface 20a opposed to the projection optical system 3, of the first lens 20 is formed to be flat similarly as in the previous embodiment, and is located at the height of the exposed surface 44, which is the same height as the surface of wafer 18 shown in FIG. 8.

To measure the imaging characteristics, a demagnified image through the projection optical system 3, of the index pattern 36a on the reticle 1 of FIG. 7 is focused near the exposed surface 44 aligned with the surface 20a of the first lens 20 in the objective lens system 17. The objective lens system 17 is constructed in the same manner as in the previous embodiment, and the illumination light IL from the demagnified image passes through the objective lens system 17 to be incident to the reflecting mirror 29 and third lens 30. The illumination light IL is bent by substantially 90° from the vertical direction into the –Y-direction by the reflecting mirror 29 to enter the third lens 30, and then passes through the third lens 30 to be incident to the reflecting mirror 31. Then the illumination light IL is bent by substantially 90° into the –X-direction by the reflecting mirror 31 to pass through the fourth lens 32 and fifth lens 33 and then to form an enlarged image of the index pattern 36a of the reticle 1 on the receiving surface 34a of the image pickup device 34. The image of the index pattern 36a is magnified several hundred times by the enlarging optical system 39A consisting of the first relay optical system 46 and second relay optical system 47 to be focused on the receiving surface 34a of the image pickup device 34. The exposed surface 44 is conjugate with the receiving surface 34a, and thus, when the image plane is defocused from the exposed surface 44, the image on the receiving surface 34a becomes blurred.

The enlarged image picked up by the image pickup device 34 is processed in the same manner as in the previous embodiment, thereby measuring the best focus position, astigmatism, curvature of field, and distortion, etc. of the projection optical system 3.

Employing the method of the present embodiment in which the second relay optical system 47, which is a part of the enlarging optical system 39A, and the image pickup element 34 are mounted in the housing member 28 and they can be removed if necessary from the Z-stage 6, the second relay optical system 47 and image pickup element 34 heavy in weight and large in space can be detached from the Z-stage 6 upon actual exposure, which can reduce the load on the z-stage 6 and can facilitate control of the wafer stage.

For example, if the excimer laser light or the like is used as the illumination light for exposure, the image pickup device becomes huge, but, employing the method of the present embodiment in that case, the load on the Z-stage 6 can be decreased.

The present embodiment is arranged in such a manner that the index patterns 36a–36e are provided on the reticle 1, the exposure illumination light IL illuminates the index pattern, and an image thereof is projected through the projection optical system 3 onto the enlarging optical system 39, but the index patterns may be provided at other places. Further, a separate light source for illuminating the index patterns may be provided, and another optical system may be employed for reduction projection. The present invention can also be applied to so-called step-and-scan type exposure apparatus as disclosed in the bulletin of Japanese Patent Application Laid-open No. 4-277612.

The present invention may have a variety of arrangements and modifications consistent with the principles described herein and is not limited to the above embodiments.

The projection exposure apparatus of the present invention can measure the imaging characteristics of projection optical system without performing test prints, by using the image pickup means (image pickup element) to pick up the enlarged image of the predetermined pattern as enlarged by the enlarging optical system. The conventional stage slit method does not need actual exposure but does need many repetitions of stage scanning in every direction of the image, whereas the method of the present invention (the image detecting method) provided with the enlarging optical system permits simultaneous detection of patterns in plural directions, for example by using as the predetermined patterns the patterns in the plural directions consisting of the line-and-space patterns extending in the X-direction, in the Y-direction, and in the directions inclined at certain angles relative to the X-direction or the Y-direction. Thus, the necessary time can be decreased.

In the case of using a light source generating pulsed laser such as excimer laser, the resolving power of the sensor for detecting an aerial image could become insufficient in the conventional stage slit method for scanning the substrate stage. In contrast, the method of the present invention normally measures the substrate stage as kept stationary, thus causing no such problem. Further, the image detecting method by the image pickup means as in the present invention is quick in response of the entire system (for example, 1/30 sec). Thus, if there is provided, for example, a television monitor or the like for converting the signal from the image pickup means into a picture, an operator can manipulate the apparatus as observing the image indicated on the television monitor, which facilitates the adjustment work of the projection optical system.

If the predetermined patterns are the reference patterns formed on the mask, there is no need to provide extra patterns at other places, which simplifies the structure.

In the case where the first lens closest to the surface of the substrate stage out of the lenses composing the enlarging optical system is fixed to the substrate stage and the image pickup means and at least a part of the enlarging optical system are detachably arranged on the substrate stage, the part of the enlarging optical system and the image pickup means, heavy in weight and large in space, can be taken away upon actual exposure, thus presenting an advantage of facilitating the control of the substrate stage. For example, in the case where excimer laser light or the like is used as the illumination light, the image pickup means becomes extremely large, and even in that case, the load on the substrate stage can be reduced.

If the surface opposed to the projection optical system, of the lens closest to the projection optical system out of the lenses composing the enlarging optical system is substantially flat, an index mark may be formed as a reference for measurement on the flat portion and autofocusing may be effected as projecting a slit image or the like from the focus position detecting system of the oblique incidence method onto the flat portion.

Further, if the surface opposed to the projection optical system, of the lens closest to the projection optical system out of the lenses composing the enlarging optical system is located at the same height as the surface of the photosensitive substrate mounted on the substrate stage, a focus position detected by the focus position detecting system can be used as it is.

What is claimed is:

1. A projection exposure apparatus, comprising:

a projection optical system to project an image of a pattern on a mask onto a photosensitive substrate;

a substrate stage to move said substrate in a direction parallel to the optical axis of said projection optical system and on a plane perpendicular to said optical axis;

an enlarging optical system which enlarges an image of a predetermined pattern prodected through said projection optical system toward said substrate stage to form an enlarged image of said predetermined pattern on an observation surface; and an image pickup device for picking up said enlarged image of said predetermined pattern on said observation surface, wherein a first lens closest to a surface of said substrate stage, out of lenses composing said enlarging optical system, is fixed to said substrate stage and wherein said image pickup device and at least a portion of said enlarging optical system are detachably arranged on said substrate stage.

2. The projection exposure apparatus according to claim 1, wherein said image pickup device is a two-dimensional image pickup device.

3. The projection exposure apparatus according to claim 1, wherein said predetermined pattern is a reference pattern formed on said mask.

4. A projection exposure apparatus comprising:

a projection optical system to project an image of a pattern on a mask onto a photosensitive substrate;

a substrate stage to move said substrate in a direction parallel to the optical axis of said projection optical system and on a plane perpendicular to said optical axis;

an enlarging optical system which enlarges an image of a predetermined pattern projected through said projection optical system toward said substrate stage to form an enlarged image of said predetermined pattern on an observation surface; and an image pickup device for picking up said enlarged image of said predetermined pattern on said observation surface, wherein a surface opposed to said projection optical system of a lens closest to said projection optical system, out of lenses composing said enlarging optical system, is substantially flat.

5. The projection exposure apparatus according to claim 1, wherein a surface opposed to said projection optical system of the lens closest to said projection optical system, out of the lenses composing said enlarging optical system, is located at the same height in said direction parallel to said optical axis as a surface of said photosensitive substrate mounted on said substrate stage.

6. The projection exposure apparatus according to claim 1, wherein an imaging characteristic of said projection optical system is measured based on an output signal from said image pickup device.

7. The projection exposure apparatus according to claim 5, wherein an imaging characteristic at an arbitrary position in an exposure field of said projection optical system is measured by moving said substrate stage in the plane perpendicular to the optical axis of said projection optical system.

8. The projection exposure apparatus according to claim 5, wherein said predetermined pattern is comprised of a line-and-space pattern along a direction parallel to a predetermined one direction and a line-and-space pattern along a direction perpendicular to said predetermined one direction.

9. The projection exposure apparatus according to claim 1, further comprising:

a focus detecting system for radiating light obliquely to said substrate and detecting a position of said substrate in the direction parallel to the optical axis of said projection optical system, wherein said focus detecting system is used to locate a surface opposed to said projection optical system, of a lens closest to said projection optical system, out of lenses composing said enlarging optical system, at a best focus position of said projection optical system.

10. A projection exposure apparatus, comprising:

a projection optical system which forms a pattern image to measure an imaging characteristic of said projection optical system;

an image pickup device to pick up an image from said pattern image, said image pickup device being constructed to be detachably arranged on a carrying stage for a photosensitive substrate; and a measurement section to measure said imaging characteristic based on the picked-up image.

11. A projection exposure apparatus according to claim 10, further comprising:

an enlarging optical system to enlarge said pattern image formed by said projection optical system, wherein said image pickup device attaches to said stage to pick up the enlarged image from said enlarging optical system, and a portion of optical elements composing said enlarging optical system is constructed to be detachably arranged on said stage.

12. A projection exposure apparatus according to claim 10, wherein said stage has a moving mechanism to move said stage in a direction parallel to an optical axis of said projection optical system.

13. A projection exposure apparatus according to claim 10, wherein said stage has a moving mechanism to move said stage in a direction perpendicular to an optical axis of said projection optical system.

14. A projection exposure apparatus according to claim 10, wherein said measurement section has a monitor to display said picked-up image.

15. A method of measuring an image characteristic of a projection optical system, comprising:

forming a pattern image with said projection optical system;

picking up an image from said pattern image with an image pickup device detachably arranged on a carrying stage for a photosensitive substrate thereon; and measuring said imaging characteristic based on the picked-up image.

16. A method according to claim 15, wherein the picked-up image is an enlarged image of said pattern image from an enlarging optical system, and a portion of optical elements composing said enlarging optical system is detachably arranged on said stage.

17. A method according to claim 16, further comprising:
detaching said image pick-up device from said stage preparatory to performing an exposure of said photosensitive substrate.

18. A projection exposure apparatus, comprising:
a projection optical system disposed on an optical axis of an illumination light to pass a part of said illumination light through said projection optical system;
a light receiving device detachably mounted on a stage to receive the part of said illumination light passed through said projection optical system, said stage having a holding portion to hold a substrate to which a pattern formed on a mask is transferred through said projection optical system; and
a measurement device connected to said light receiving device to measure an optical characteristic of said projection optical system based on the part of said illumination light received by said light receiving device.

19. A projection exposure apparatus according to claim 18, wherein said mask is disposed between a light source and said projection optical system, and the part of said illumination light comes from a basic pattern formed on said mask.

20. A projection exposure apparatus according to claim 19, wherein said basic pattern includes a plurality of line-and-space patterns oriented in different directions from each other.

21. A projection exposure apparatus according to claim 18, wherein said light receiving device has a two-dimensional CCD and an optical system to guide the part of said illumination light passed through said projection optical system onto said two-dimensional CCD, and said measurement device is connected to said two-dimensional CCD.

22. A projection exposure apparatus according to claim 21, wherein said optical system of said light recieving device enlarges the part of said illumination light passed through said projection optical system to guide the enlarged part of said illumination light onto said two-dimensional CCD.

23. A projection exposure apparatus according to claim 21, wherein a portion of optical elements composing said optical system of said light recieving device is detachably mounted on said stage.

24. A projection exposure apparatus according to claim 23, wherein a first lens, closest to said projection optical system, of optical elements composing said optical system of said light recieving device is fixed to said stage.

25. A projection exposure apparatus according to claim 24, wherein a surface opposed to said projection optical system of said first lens is located at a same height as a surface of said substrate held by said stage.

26. A projection exposure apparatus according to claim 24, further comprising:
a focus detecting system to detect a position of said substrate in a direction parallel to an optical axis of said projection optical system, and
wherein said focus detecting system is used to locate the surface, opposed to said projection optical system, of said first lens at a best focus position of said projection optical system.

27. A method of measuring an optical characteristic of a projection optical system, comprising:
receiving a light passed through said projection optical system from a mask with a light receiving device detachably mounted on a stage which holds a substrate; and
measuring the optical characteristic of said projection optical system based on the light from said mask received by said light receiving device.

28. A method according to claim 27, wherein a pattern is formed on said mask, and said light receiving device receives light from said pattern.

29. A method of making an exposure apparatus, comprising:
disposing a projection optical system on an optical axis of an illumination light to pass a part of said illumination light through said projection optical system;
mounting a light receiving device detachably on a holding stage for a substrate, said light receiving device receiving the part of said illumination light passed through said projection optical system; and
connecting a measurement device to said light receiving device, said measurement device measuring an optical characteristic of said projection optical system based on the part of said illumination light received by said light receiving device.

30. A projection exposure apparatus, comprising:
a projection optical system which projects an image of a pattern onto a projection surface;
an optical member which is disposed on an incident side of said projection optical system, and which emits an optical characteristic measuring light to said projection optical system;
a stage to hold a substrate at said projection surface; and
a light receiving device holding portion which is provided on said stage, and which detachably and attachably holds a light receiving device which receives said optical characteristic measuring light passed through said projection optical system.

31. A projection exposure apparatus according to claim 30, wherein said optical member is a mask formed with said pattern, and said optical characteristic measuring light is light from said pattern.

32. A projection exposure apparatus according to claim 31, wherein said pattern is an optical characteristic measuring pattern including a plurality of line-and-space patterns oriented in different directions from each other.

33. A projection exposure apparatus according to claims 30, wherein
said light receiving device has a two-dimensional CCD and a measurement optical system to guide said optical characteristic measuring light passed through said projection optical system onto said two-dimensional CCD, and
said two-dimensional CCD of said light receiving device is connected to a measuring device which measures an optical characteristic of said projection optical system based on said optical characteristic measuring light received by said two-dimensional CCD.

34. A projection exposure apparatus according to claim 33, wherein said light receiving device holding portion holds a portion of plural optical elements composing said measurement optical system.

35. A projection exposure apparatus according to claim 34, wherein said portion of plural optical elements is a first lens which is closest to said projection optical system.

36. A projection exposure apparatus according to claim 35, wherein a surface opposed to said projection optical system of said first lens is located at the same height as a surface of said substrate held by said stage.

37. A projection exposure apparatus according to claim 29, wherein said optical characteristic includes at least one of a best focus position, a distortion, an astigmatism, and a curvature of a field.

38. A measurement apparatus which measures an optical characteristic, comprising:

a light receiving device which is provided on a substrate stage of a projection exposure apparatus;

said projection exposure apparatus including a projection optical system projecting an image of a pattern onto a projection surface, an optical member disposed on an incident side of said projection optical system, and said substrate stage;

said optical member emitting an optical characteristic measuring light to said projection optical system;

said light receiving device receiving said optical characteristic measuring light passed through said projection optical system; and a measuring device which is connected to said light receiving device, and which measures an optical characteristic of said projection optical system based on said optical characteristic measuring light received by said light receiving device.

39. A measurement apparatus according to claim 38, wherein said light receiving device has a two-dimensional CCD and an optical system to guide said optical characteristic measuring light passed through said projection optical system onto said two-dimensional CCD.

40. A measurement apparatus according to claim 39, wherein a portion of optical elements composing said optical system of said light receiving device is fixed to said substrate stage, and a remaining portion of said optical elements is detachably mounted on said substrate stage.

41. A measurement apparatus according to claim 38, wherein said optical characteristic includes at least one of a best focus position, a distortion, an astigmatism, and a curvature of a field.

42. A method of measuring an optical characteristic of a projection optical system, comprising:

emitting an optical characteristic measuring light to said projection optical system;

receiving said optical characteristic measuring light, passed through said projection optical system, by a light receiving device detachably mounted on a holding stage for a substrate; and measuring an optical characteristic of said projection optical system based on said optical characteristic measuring light received by said light receiving device.

43. A method according to claim 42, wherein said projection optical system projects a pattern of a mask onto a projection surface, said optical characteristic measuring light is a light from an optical characteristic measuring pattern formed on said mask, and said light receiving device receives the light from said pattern.

44. A method of making an exposure apparatus, comprising:

disposing a projection optical system between a substrate stage and an illumination optical system which illuminates a pattern, said projection optical system projecting an image of said pattern to said substrate stage;

disposing an optical member on an incident side of said projection optical system, said optical member emitting an optical characteristic measuring light; and providing a light receiving device holding portion on said substrate stage, said light receiving device holding portion detachably holding a light receiving device which receives said optical characteristic measuring light passed through said projection optical system.

45. A projection exposure apparatus, comprising:

a projection optical system which projects an image of a pattern onto a projection surface;

an optical member which is disposed on an incident side of said projection optical system, and which emits an optical characteristic measuring light to said projection optical system;

a substrate stage to hold a substrate at said projection surface;

a light receiving device which is detachably mounted on said substrate stage, and which receives said optical characteristic measuring light passed through said projection optical system; and a measuring device which is connected to said light receiving device, and which measures an optical characteristic of said projection optical system based on said optical characteristic measuring light received by said light receiving device.

* * * * *